United States Patent [19]
Bothra et al.

[11] Patent Number: 6,020,616
[45] Date of Patent: Feb. 1, 2000

[54] AUTOMATED DESIGN OF ON-CHIP CAPACITIVE STRUCTURES FOR SUPPRESSING INDUCTIVE NOISE

[75] Inventors: Subhas Bothra, San Jose; Paul R. Findley, Cupertino, both of Calif.

[73] Assignee: VLSI Technology, Inc., San Jose, Calif.

[21] Appl. No.: 09/052,908

[22] Filed: Mar. 31, 1998

[51] Int. Cl.$^7$ .............................. H01L 27/10; H01L 29/00
[52] U.S. Cl. .................... 257/381; 257/207; 257/208; 257/532
[58] Field of Search .................... 257/207, 208, 257/210, 300, 379, 393, 401, 531, 532, 8

[56] References Cited

U.S. PATENT DOCUMENTS

| | | | |
|---|---|---|---|
| 4,453,090 | 6/1984 | Sempel . | |
| 4,783,692 | 11/1988 | Uratani . | |
| 4,786,828 | 11/1988 | Hoffman | 307/303 |
| 4,812,962 | 3/1989 | Witt | 364/490 |
| 5,266,821 | 11/1993 | Chern et al. | 257/312 |
| 5,408,538 | 4/1995 | Kitakado et al. | 382/8 |
| 5,459,093 | 10/1995 | Kuroda et al. | 437/51 |
| 5,475,766 | 12/1995 | Tsuchiya et al. | 382/144 |
| 5,546,225 | 8/1996 | Shiraishi | 359/559 |
| 5,553,273 | 9/1996 | Liebmann | 395/500 |
| 5,576,565 | 11/1996 | Yamaguchi et al. | 257/296 |
| 5,606,197 | 2/1997 | Johansson et al. | 257/532 |
| 5,616,940 | 4/1997 | Kato et al. | 257/206 |
| 5,631,492 | 5/1997 | Ramus et al. | 257/532 |
| 5,761,075 | 6/1998 | Oi et al. | 364/488 |
| 5,795,683 | 8/1998 | Uno et al. | 430/5 |
| 5,796,148 | 8/1998 | Gorman | 257/379 |
| 5,798,937 | 8/1998 | Bracha et al. | 364/490 |
| 5,844,301 | 12/1998 | Van Roosmalen | 257/532 |
| 5,872,862 | 2/1999 | Okubo et al. | 382/151 |

*Primary Examiner*—Ngân V. Ngôo
*Attorney, Agent, or Firm*—Martine Penilla & Kim, LLP

[57] ABSTRACT

Disclosed is a network of on-chip capacitive structures for suppressing power supply inductive noise, methods for making, and systems for designing the on-chip capacitive structures. The network includes a plurality of dummy active regions that are dispersed throughout an integrated circuit design that has a plurality of active regions. The plurality of dummy active regions are separated from the plurality of active regions by at least a bloat distance. The network further includes a network of dummy polysilicon lines that are configured to overlie selected dummy active regions. The network of dummy polysilcon lines that overlie the selected dummy active regions function as dummy gates. In this embodiment, the selected dummy active regions and the dummy polysilicon lines that overlie the selected dummy active regions form the network of on-chip capacitive structures.

21 Claims, 16 Drawing Sheets

| Point | TECH. | $V_{DD}$ | NM | Voltage |
|-------|-------|----------|-----|---------|
| A | 0.5μ | 5v | 12% | 0.6v |
| B | 0.35μ | 3.3v | 10% | 0.33v |
| C | 0.25μ | 2.5v | 8% | 0.2v |
| D | 0.18μ | 1.8v | 6% | 0.1v |

FINAL ACTIVE & DUMMY ACTIVE

FINAL POLY & DUMMY POLY

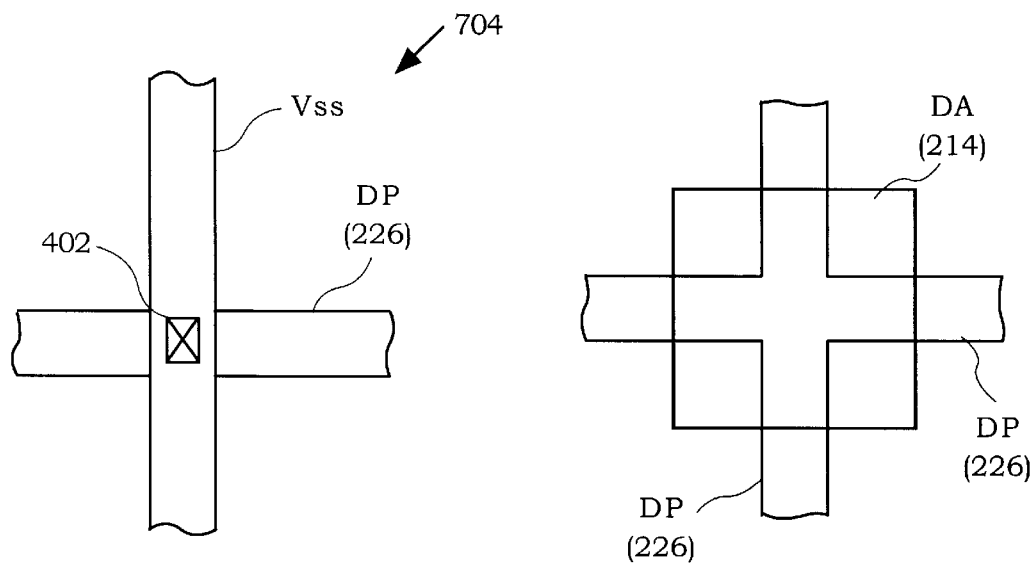
FIG. 7B
FIG. 7C
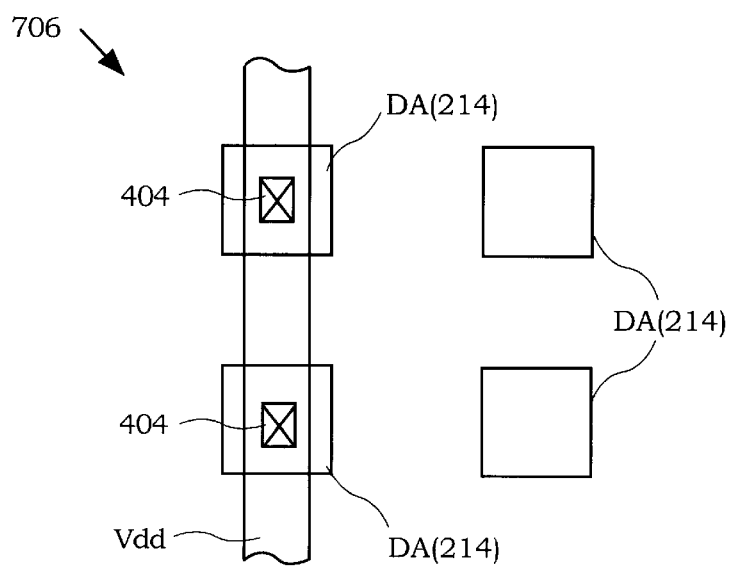
FIG. 7D

AUTOMATED DESIGN OF ON-CHIP CAPACITIVE STRUCTURES FOR SUPPRESSING INDUCTIVE NOISE

CROSS REFERENCE TO RELATED APPLICATIONS

This application is related to the following U.S. patent application entitled "Shallow Trench Capacitive Structures For Suppressing Inductive Noise and Methods for Making the Same," having U.S. Ser. No. 09/052,865 (attorney docket no. VTI1P191), filed on the same day as the instant application. This application is hereby incorporated by reference.

BACKGROUND OF THE INVENTION

1. Field of the Invention

The present invention relates generally to semiconductor circuits and, more particularly, to an automated method for designing on-chip capacitive structures to suppress inductive noise in high performance integrated circuit applications.

2. Description of the Related Art

The continuing trend in modem integrated circuit design is to decrease the physical size of a chip, increase circuit layout density, and increase operating speeds. Although designers have been able to design very high frequency devices that operate at lower power supply voltages, a substantial increase in inductive noise due to a chip's package and printed circuit board (PCB) routing has also occurred. In the past, off-chip discrete capacitor components have been attached directly onto a chip's package or the PCB in order to capacitively shunt the ever increasing inductive noise. Although this has worked with some success in the past, as devices continue to be improved to operate at faster speeds and lower power supply voltages, the allowable noise margin for the inductive noise has also continued to decrease. That is, as devices become faster and faster, a device may fail to operate properly if the inductive noise rises above predetermined allowable noise margins, which necessarily decrease as speeds increase.

FIG. 1A is a simplified diagram of a PCB 100 having a packaged chip integrated onto the PCB 100. In this example, a chip 102 is integrated onto a package 104, which has a plurality of traces 106 that connect the chip 102 to the lead pins of the package 104. As mentioned above, a customary method of suppressing the inductive noise is to attach off-chip discrete capacitor components 108 or 112 on the package 104 or the PCB 100, respectively. Although this has worked in the past, the increased amount of inductive noise produced in devices having clock frequencies above about 200 MHz has been found to be too much for off-chip discrete components to handle. As a result, many high speed devices suffer in having noise margins that exceed the amount recommended for proper high performance operation.

For illustration purposes, FIG. 1B shows a graph 150 that plots allowable noise margins vs. clock frequencies. A plot line 152 illustrates that as clock frequencies increase, the allowable noise margins also decrease. For example, a point A shows that for a 0.5 micron technology device, the allowable noise margin is slightly below about 12% of the voltage source (i.e., Vdd) used. FIG. 1C provides a graph 160 that plots the allowable noise margins as a percentage of the voltage source, where a full rail Vdd is 100%.

Referring back to FIG. 1B, a point B illustrates that the allowable noise margin drops to about 10% of the voltage source used for a 0.35 micron technology device. A point C illustrates that the allowable noise margin drops again to about 8% of the voltage source used for a 0.25 micron technology device, and a point D illustrates that the allowable noise margin drops to about 6% of the voltage source used for a 0.18 micron technology device. FIG. 1C also plots the allowable percentage noise margin for a 0.25 micron technology device.

As can be appreciated, the faster the device gets, the smaller the allowable noise margin becomes, and because lower voltage sources are used for smaller technology devices, the actual voltage magnitude of the allowable noise margin also decreases more substantially. To illustrate this point, reference is drawn to FIG. 1D, where the exemplary micron technologies are compared with respect to the allowable noise margins (NMs), and the resulting voltage magnitudes.

For example, for a 0.5 micron technology device, the voltage source is 5V and the allowable noise margin is about 12%. This therefore produces a noise margin voltage magnitude of about 0.6V. This can then be compared to a 0.18 micron technology device which has a voltage source of 1.8V, and an allowable noise margin of about 6%. The resulting noise margin voltage magnitude will be about 0.1V. Thus, not only does the allowable noise margin decrease as device speed increases, but the voltage supply used in smaller micron technology devices also decreases.

Consequently, that faster and smaller the device, the less it will be able to handle even very small noise margins. Further yet, the faster the device becomes, even more inductive noise tends to be produced. To remedy this, some designers have begun to custom design on-chip capacitors into existing designs. Unfortunately, the design of custom on-chip capacitors has the disadvantage of requiring a substantial amount of chip area, which in some cases may be up to 10% or more additional chip area. Further yet, the design of custom on-chip capacitors also requires time consuming manual examination and modification of the photolithography masks used to design the multi-layered devices.

As can be appreciated, this type of custom design can be very costly, however, this expense has become necessary in order to appropriately suppress the growing levels of inductive noise produced in higher performing devices.

In view of the foregoing, there is a need for automated techniques that enable fast and efficient design and fabrication of on-chip capacitive structures for suppressing power supply inductive noise.

SUMMARY OF THE INVENTION

Broadly speaking, the present invention fills these needs by providing an automated technique for designing on-chip capacitive structures over dummy active regions, that are intelligently dispersed throughout an integrated circuit chip to reduce topographical variations. It should be appreciated that the present invention can be implemented in numerous ways, including as a process, an apparatus, a system, a device, or a method. Several inventive embodiments of the present invention are described below.

In one embodiment, a network of on-chip capacitive structures for suppressing power supply inductive noise is disclosed. The network includes a plurality of dummy active regions that are dispersed throughout an integrated circuit design that has a plurality of active regions. The plurality of dummy active regions are separated from the plurality of active regions by at least a bloat distance. The network further includes a network of dummy polysilicon lines that are configured to overlie selected dummy active regions. The network of dummy polysilicon lines that overlie the selected dummy active regions function as dummy gates. In this embodiment, the selected dummy active regions and the dummy polysilicon lines that overlie the selected dummy active regions form the network of on-chip capacitive structures.

In another embodiment, a method for making a network of on-chip capacitive structures for suppressing power supply inductive noise is disclosed. The method includes designing a plurality of dummy active regions that are dispersed throughout an integrated circuit design that has a plurality of active regions. The plurality of dummy active regions are separated from the plurality of active regions by at least a bloat distance. Designing a network of dummy polysilicon lines that are configured to overlie selected dummy active regions, and the network of dummy polysilicon lines that overlie the selected dummy active regions function as dummy gates. In this embodiment, the selected dummy active regions and the dummy polysilicon lines that overlie the selected dummy active regions define capacitor structure locations for the network of on-chip capacitive structures.

In yet another embodiment, a system for designing a network of on-chip capacitive structures for suppressing power supply inductive noise is disclosed. The system includes means for designing a plurality of dummy active regions that are dispersed throughout an integrated circuit design that has a plurality of active regions. The plurality of dummy active regions are separated from the plurality of active regions by at least a bloat distance. The plurality of dummy active regions are further configured to reduce topographical variations in shallow isolation regions that are designed around the plurality of dummy active regions and the plurality of active regions. The system further includes means for designing a network of dummy polysilicon lines that are configured to overlie selected dummy active regions, and the network of dummy polysilicon lines that overlie the selected dummy active regions function as dummy gates. In this embodiment, the selected dummy active regions and the dummy polysilicon lines that overlie the selected dummy active regions define capacitor structure locations for the network of on-chip capacitive structures.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

FIGS. 7B–7D illustrate the mask processing operations used to interconnect the ground rail Vss to respective dummy polysilicon, and to interconnect the power supply rail Vdd to respective dummy active regions.

DETAILED DESCRIPTION OF THE PREFERRED EMBODIMENTS

An invention for an automated technique for designing on-chip capacitive structures over a network of dummy active regions and dummy polysilicon lines is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

As the size of semiconductor device features continue to shrink and the demand for increased circuit density has correspondingly increased, semiconductor device designers have been turning to automated design tools to quickly analyze and compare multiple design layer masks. As is well known, each design layer is typically stored as a digital data file that identifies the X and Y coordinates of the various features that lie on each design layer. In the various embodiments of the present invention, a mask generator software layout tool that empowers designers to perform numerous logical operations, such as, AND operations, OR operations, XOR operations, etc., between the digital data of two design layer masks is used. The mask generation software tool also enables operations that increase the size (i.e., bloat operator) of selected features on a given design layer mask. One exemplary mask generation tool is a product named CATS (computer aided transcription system), which is made by Transcription Enterprises, L.T.D., of Los Gatos, Calif. Once a design layer is complete, it may be transferred to a reticle (i.e., to make a reticle mask) that is used in standard photolithography fabrication operations.

Figure 1A:
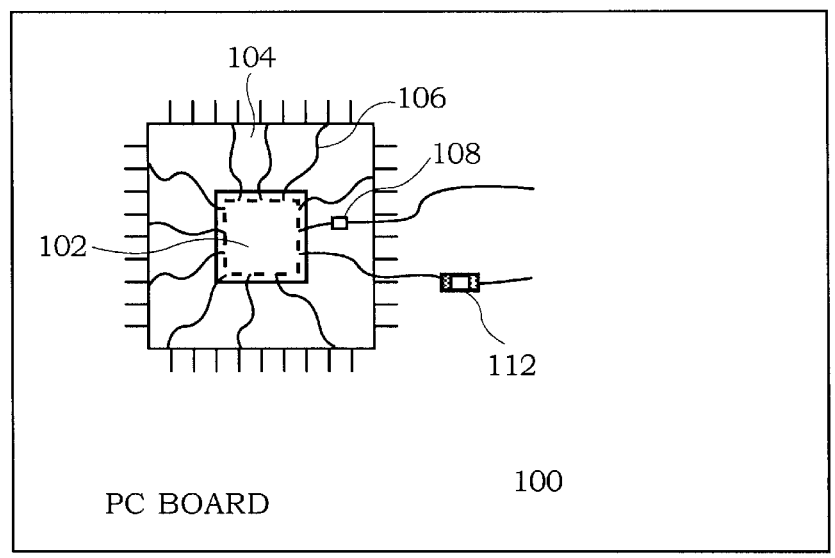
FIG. 1A is a simplified diagram of a PCB having a packaged chip integrated thereon, and discrete capacitor components electrically connected to the packaged chip.
Figure 1B:
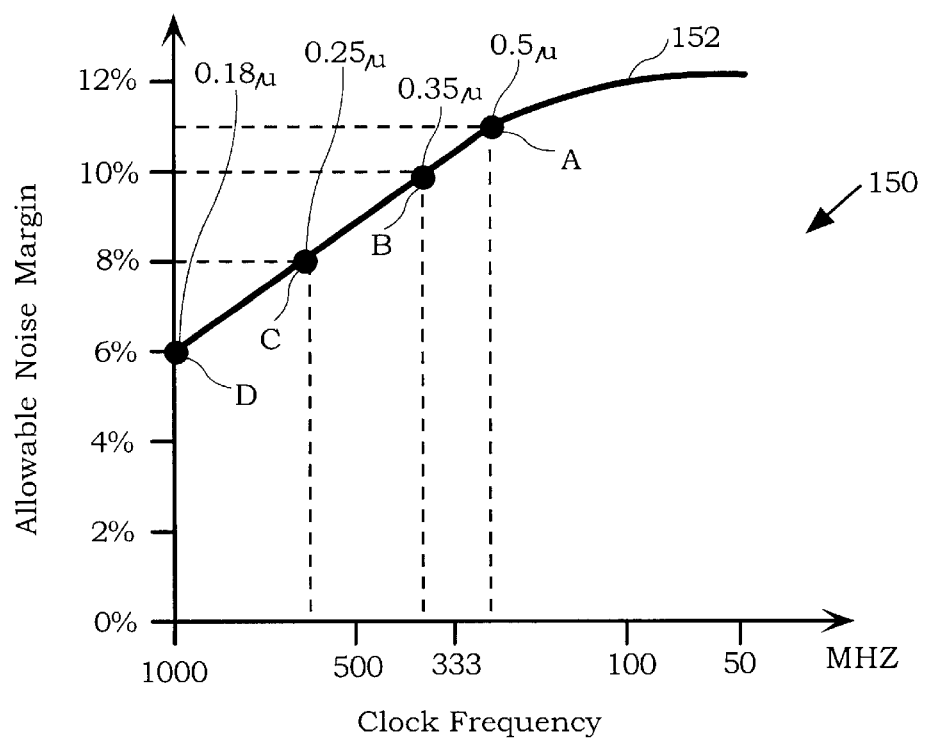
FIG. 1B is a graph that plots allowable noise margins vs. clock frequencies.
Figures 1C, 1D:
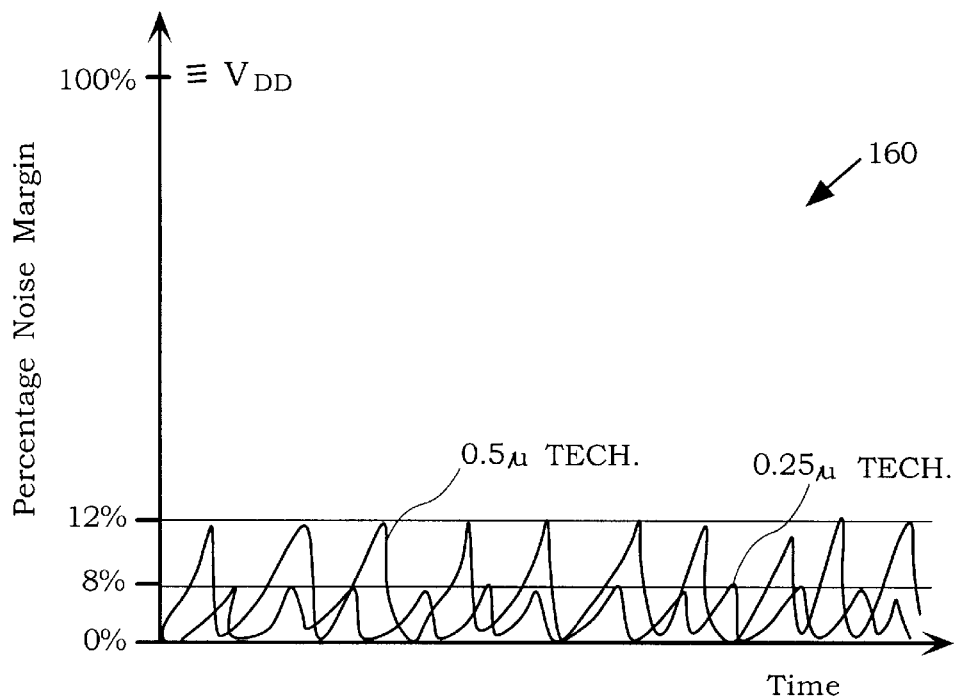
FIG. 1C is a graph that plots percentage noise margin vs. time for comparative micron device technologies.
FIG. 1D is a table that illustrates the difference in allowable noise margins as micron technologies continue to decrease.
Figure 2A:
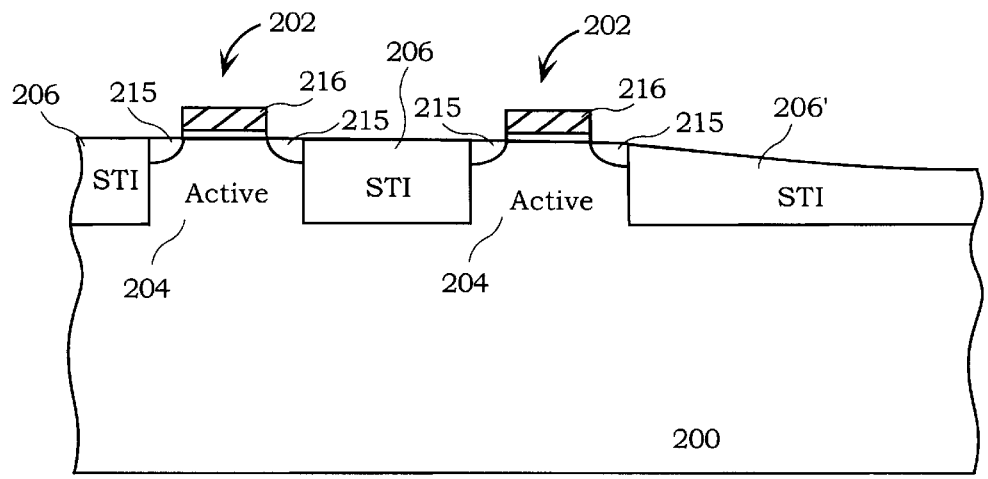
FIGS. 2A–2B show cross-sectional views of semiconductor substrates having active regions for designing transistors in accordance with one embodiment of the present invention.

FIG. 2A shows a cross-sectional view of a semiconductor substrate 200 having active regions 204 for defining transistors 202 in accordance with one embodiment of the present invention. The active regions 204 are preferably isolated from neighboring active regions 204 by oxide filled shallow trench isolation (STI) regions 206. As shown, the active regions 204 have diffusion regions 215 which define the source and drains of the transistors 202, which have polysilicon gates 216 that are defined over respective gate oxides.

In conventional processing, it was discovered that when active regions 204 are separated by long spans from each other, the shallow trench isolation (STI) 206' tends to form a lower topographical profile than do the STI regions 206 that lie between densely arranged transistors 202. In one embodiment of the present invention, dummy active (DA) regions 214 are designed and fabricated throughout the semiconductor substrate 200 (e.g., in unused substrate areas) that are near active regions 204. These dummy active regions 214 assist the oxide in the shallow trench isolation (STI) regions 206 to have a more even topographical profile.

Figure 2B:
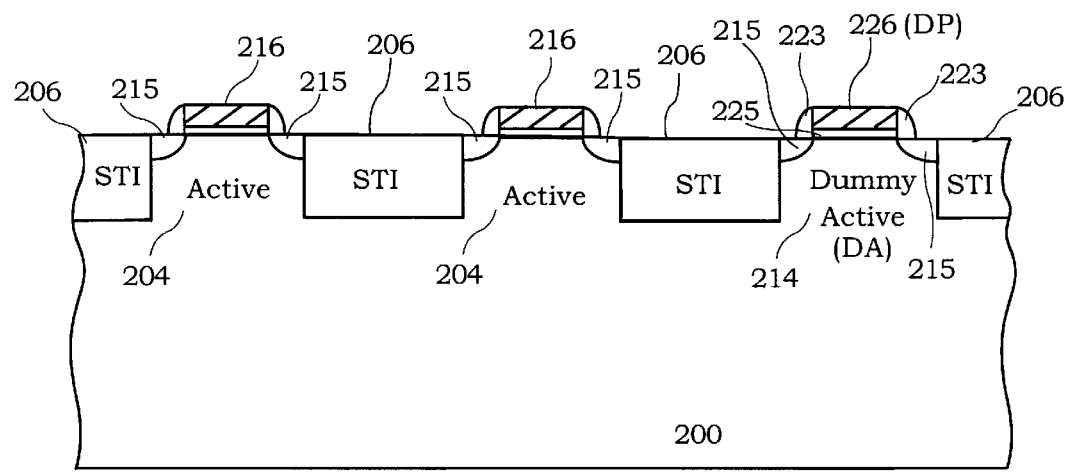

As a result of forming the dummy active regions 214, a more even topographical profile will result throughout substantially all of the semiconductor substrate 200 (and the wafer), which produces a more planar surface. In the example of FIG. 2B, the dummy active regions 214 are also shown having diffusion regions 215, a gate oxide 225, spacers 223, and a polysilicon gate 226. In this embodiment, the polysilicon gate 226 (i.e., dummy polysilicon) will actually be a network of polysilicon lines that interconnect most of the dummy active regions 214. This polysilicon line network that defines polysilicon gate 226 is shown in greater detail in FIG. 3G.

In general, the dummy active regions 214 are dispersed throughout the semiconductor substrate 200 in regions where there are no active regions 204. To accomplish this, a mask generation software layout tool is used to analyze the layout designs for automatically inserting dummy active regions 214 where there are no active regions 204. As will be described in greater detail below, the dummy active regions 214 and the polysilicon gate 226 lines will be used to make capacitive structures that are coupled between a power supply voltage rail (Vdd) and a ground voltage rail (Vss). These capacitive structures therefore assist in suppressing the inductive noise produced in high speed integrated circuit devices. One particularly advantageous result of designing the capacitive structures over dummy active regions 214 is that those regions would normally remain as unused wasted die space.

Figure 3A:
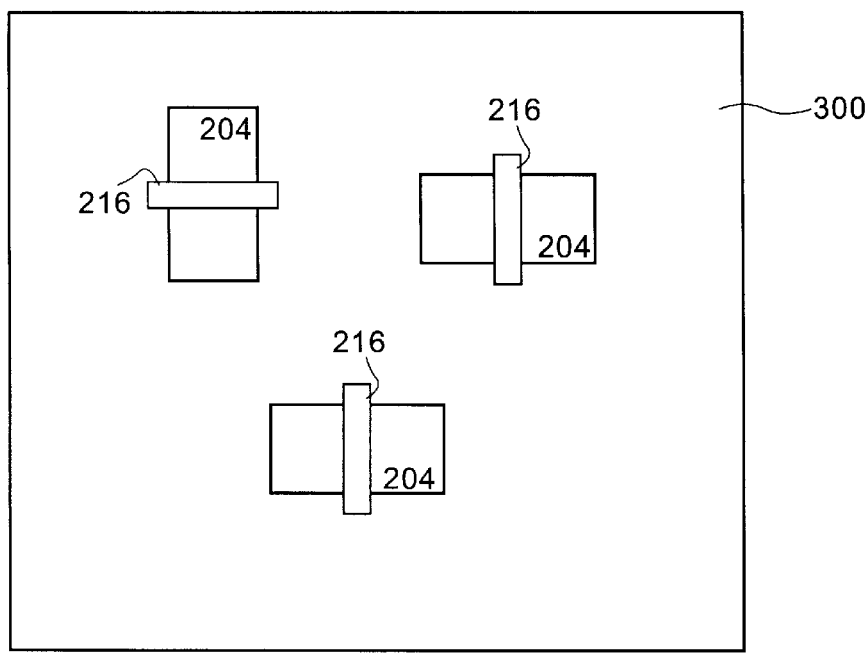
FIG. 3A shows a top view of two masks which illustrate three exemplary active regions and three exemplary polysilicon gates in accordance with one embodiment of the present invention.

FIG. 3A shows a top view of two masks 300 which illustrate three exemplary active regions 204 and three exemplary polysilicon gates 216 in accordance with one embodiment of the present invention. Although the mask for the active regions 204 and the mask for the polysilicon gates 216 are shown in one mask layout 300, it should be understood that they are actually two masks files. These files will be used to enable the design of the dummy active regions 214 and the dummy polysilicon lines 226 in areas where neither the active regions 204 or the polysilicon lines 216 lie.

Figure 3B:
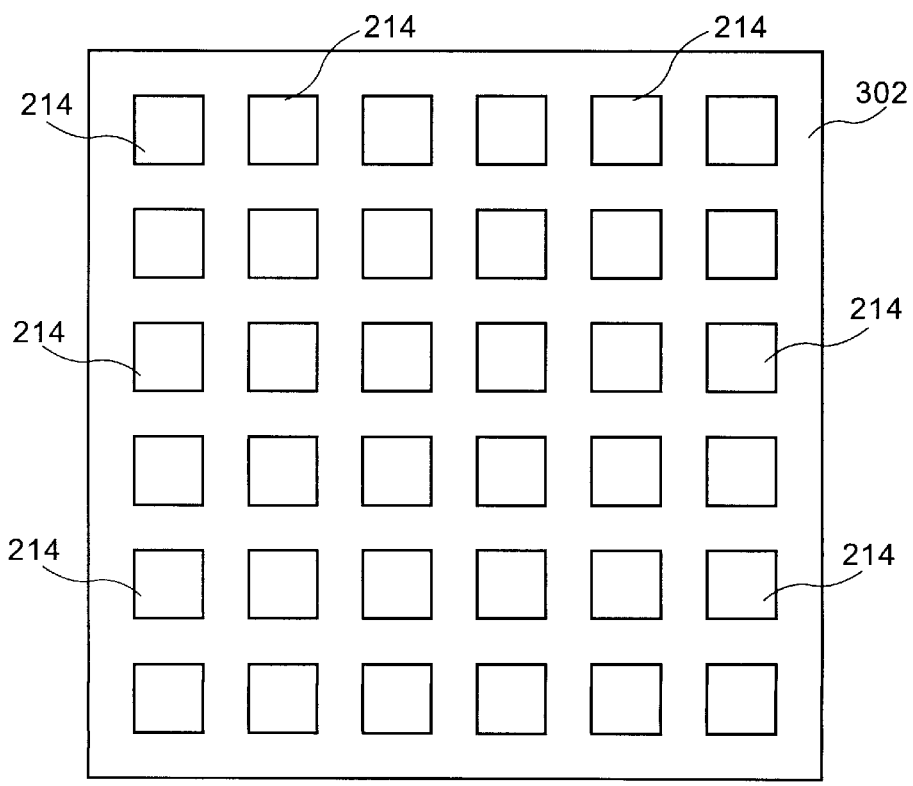
FIGS. 3B–3L show a progression of mask designs for generating a final active and dummy active region mask of FIG. 3F, and a final polysilicon and dummy polysilicon mask of FIG. 3K.
Figure 3C:
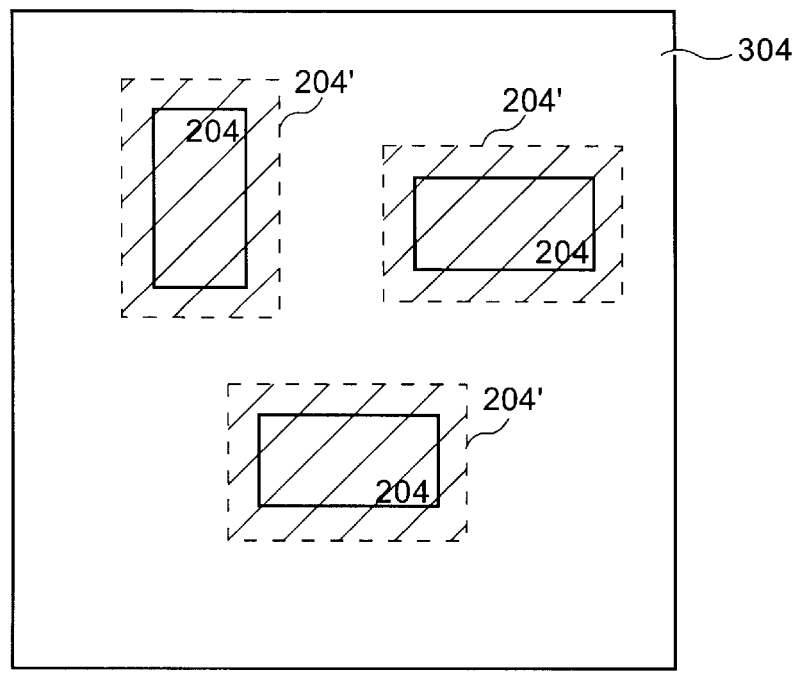

Once a mask identifying the coordinates for each of the active regions 204 in a particular integrated circuit design is provided, a standard fill pattern mask 302 which is shown in FIG. 3B, is used to identify those coordinates where dummy active regions 214 should be placed. In one embodiment, the dummy active regions, for an exemplary 0.25 micron technology device, will be about 10 micron squares. Initially, the mask generator will take the active region mask that has all of the active regions 204 and perform a bloat operation which is shown in FIG. 3C. The mask 304 of FIG. 3C therefore shows that the size of the active regions 204 have been expanded outwardly by a bloat amount. In one embodiment, the bloat amount is preferably between about 2 microns and about 25 microns, and most preferably about 5 microns. The most preferred 5 micron bloat dimension is selected for a 0.25 micron technology design, however, larger or smaller bloat dimensions may be selected depending on the micron technology device being designed.

Figure 3D:
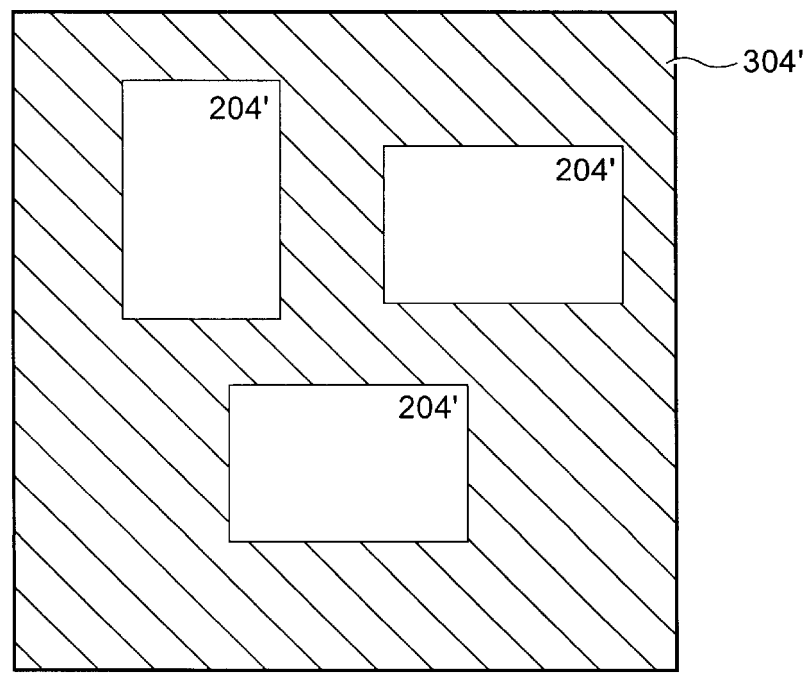

Once the active regions have been bloated using the mask generator software, the mask 304 is inverted using an inversion operation. The inversion operation therefore produces a mask 304' which is shown in FIG. 3D. Once the inverted mask 304' has been produced, the mask 304' and the standard fill pattern mask 302 of FIG. 3B are processed by the mask generator using a logical AND operator. That is, the standard fill pattern mask 302 having the dummy active regions 204 are logically processed through an AND operation with the inverted mask 304' of FIG. 3D.

Figure 3E:
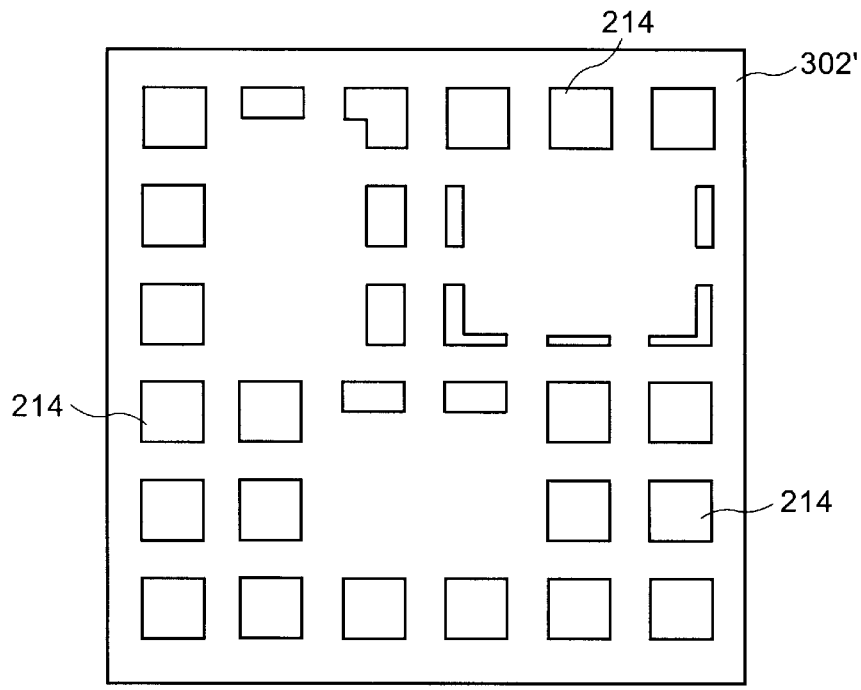

The result of this logical AND operation will therefore produce a mask 302' which is shown in FIG. 3E. The logical operation that produced mask 302' therefore eliminates the dummy active regions 214 from those regions in which the active regions 204 will ultimately lie, plus a buffer of about 5 microns that was set by the aforementioned bloat operation of FIG. 3C.

Figure 3F:
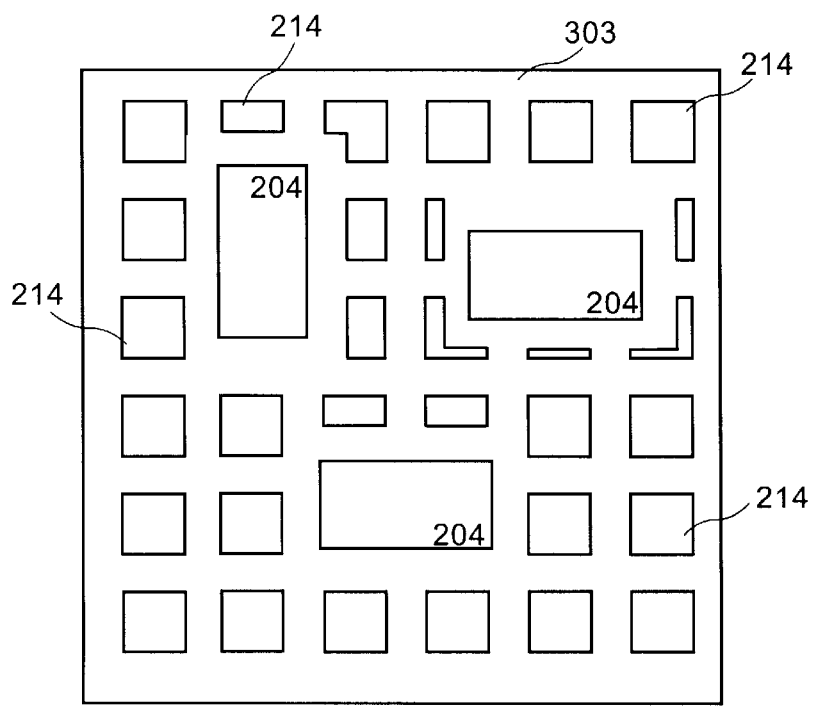

At this point, the mask 302' is put through another logical operator. The next logical operator is an OR operator which combines the features of mask 302' and the active regions 204 of FIG. 3A. The resultant of the logical OR operator is a mask 303, which is shown in FIG. 3F. Mask 303 represents a final active and dummy active region mask. It should be noted that by performing the boat operation of FIG. 3C, a buffer is defined around the active regions 204. In one embodiment, this buffer essentially defines where the shallow trench isolation (STI) regions will reside in the final physical device.

Furthermore, because dummy active regions 214 are intelligently placed in areas where the active regions 204 do not lie, a substantially more planar topology will result.

The following table illustrates the logical operations that are performed to generate the final active and dummy active mask 303 of FIG. 3F.

TABLE A

Final Active & Dummy Active

| Step | Operation Performed | Mask Produced |
| --- | --- | --- |
| 1 | Bloat {Active Regions} | Mask 304 |
| 2 | Invert Mask 304 | Mask 304' |
| 3 | {Mask 302} AND {Mask 304'} | Mask 302' |
| 4 | {Mask 302'} OR {Active Regions} | Mask 303 |

Figure 3G:
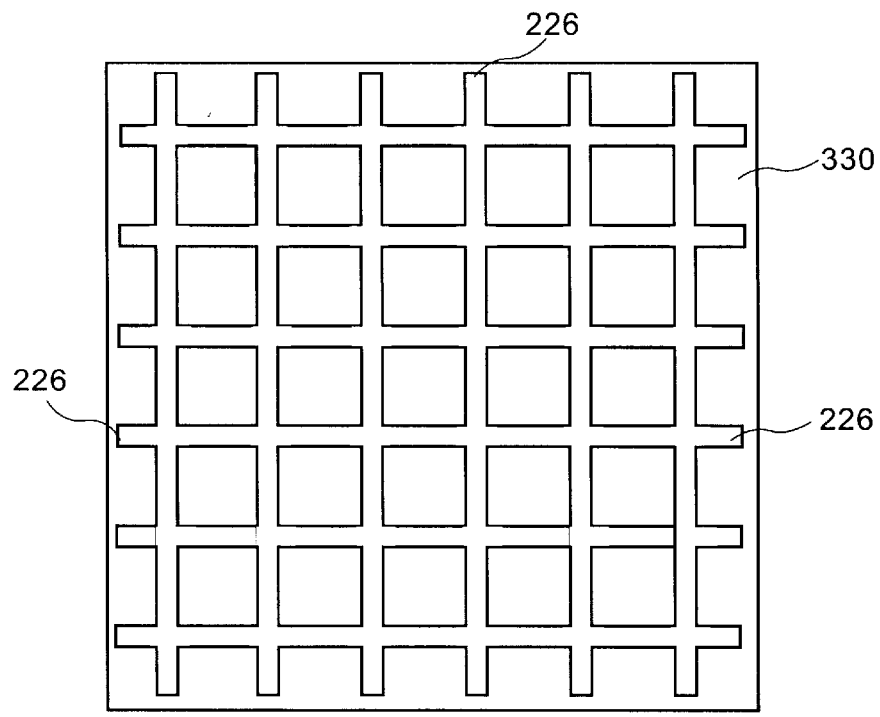

FIG. 3G shows a dummy polysilicon mask 330 having dummy polysilicon lines 226 (which also define the gates over the dummy active regions 214). As will be discussed in greater detail below, the dummy polysilicon lines 226 will function to interconnect most of the various dummy active regions 214 which will be subsequently used to form capacitive structures. In this embodiment, the width of the dummy polysilicon lines, in an exemplary 0.25 micron technology device, will have about 2.5 micron widths. In addition, the physical dummy polysilicon lines that are patterned from the dummy polysilicon mask 330 will preferably be silicided lines, which will advantageously reduce the series resistance along those interconnecting poly lines.

Figure 3H:
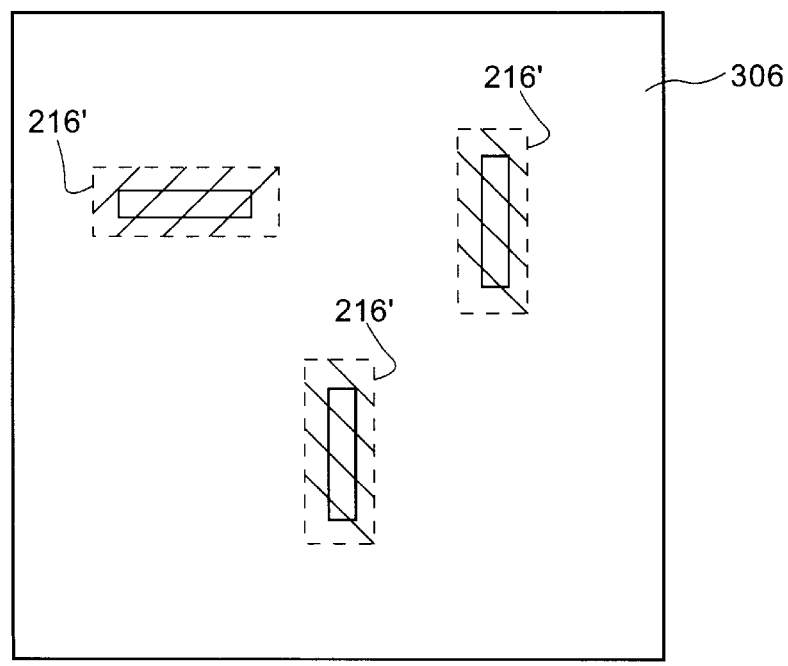

As mentioned above, the dummy polysilicon mask 330 is configured to interconnect the gates that overlie the dummy active regions 214, and therefore, a large enough capacitor will be produced to enable an adequate level of inductive noise suppression. Once the dummy polysilicon mask 330 has been designed, the next step requires that the polysilicon lines 216 of FIG. 3A be put through a bloat operation, which produces bloated polysilicon lines 216' as shown in FIG. 3H.

Figure 3I:
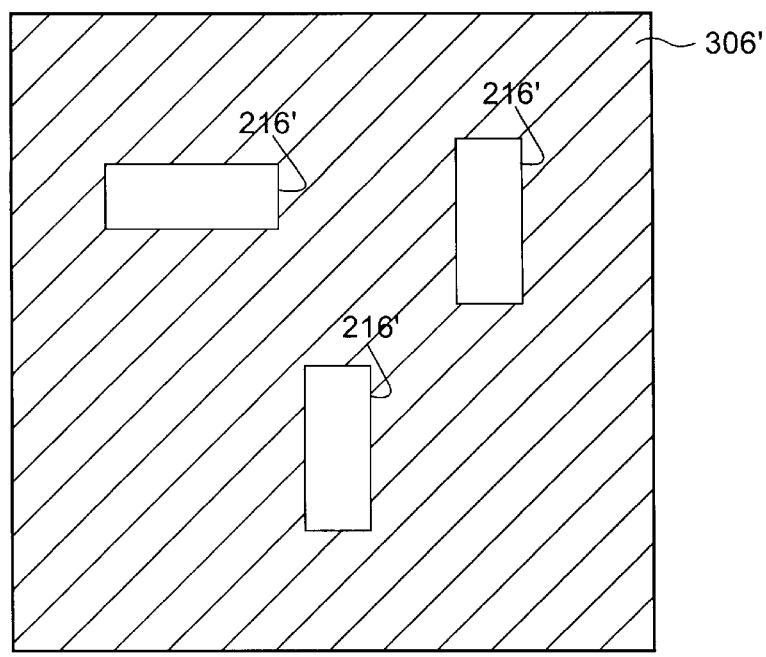

The bloated polysilicon mask 306 is then inverted to produce an inverted bloated polysilicon mask 306' which is shown in FIG. 3I. Once the inverted bloated polysilicon mask 306' has been produced, a number of logical operations are performed. Initially, the inverted bloated polysilicon mask 306' is put through an AND logical operation with the dummy polysilicon mask 330 of FIG. 3G. The result of the logical AND operation will therefore produce an intermediate dummy polysilicon mask (not shown) without the dummy polysilicon lines 226 where the bloated polysilicon lines 216' of FIG. 3I were positioned.

In a next operation, the intermediate dummy polysilicon mask (not shown) is placed through a logical AND operation with the inverted bloated mask 304' of FIG. 3D. As a result of these two AND operations, a modified polysilicon mask 330' is produced. It should be noted that the modified polysilicon mask 330' of FIG. 3J excludes dummy polysilicon lines 226 in regions where both the bloated polysilicon lines 216' of FIG. 3I lie, and the bloated active regions 204' of FIG. 3D lie. In a next operation, the modified polysilicon mask 330' is put through a logical OR operation with the polysilicon lines 216 of FIG. 3A.

Figure 3J:
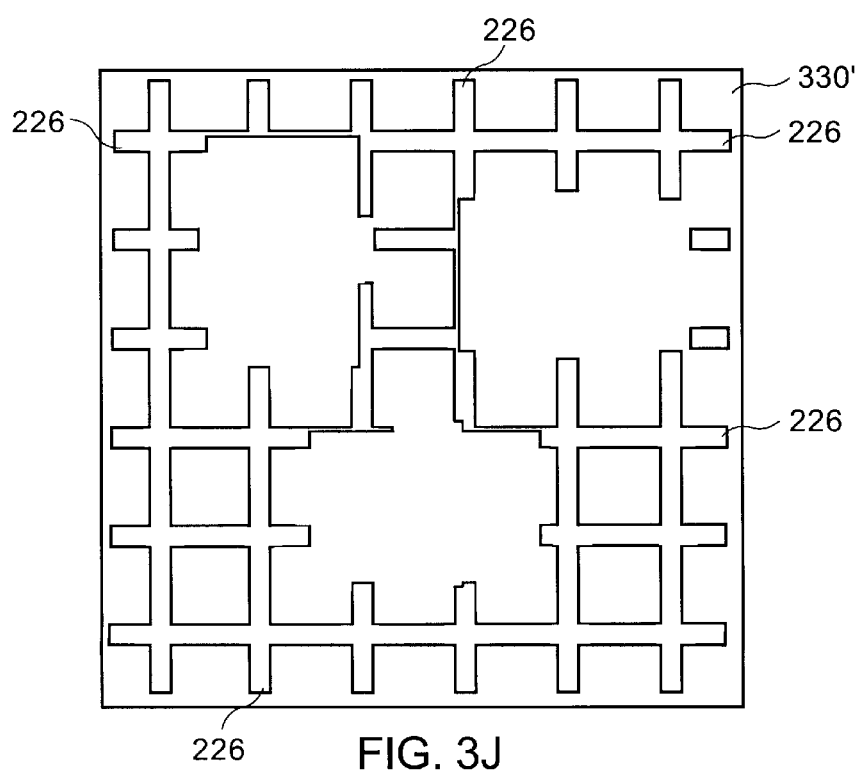
Figure 3K:
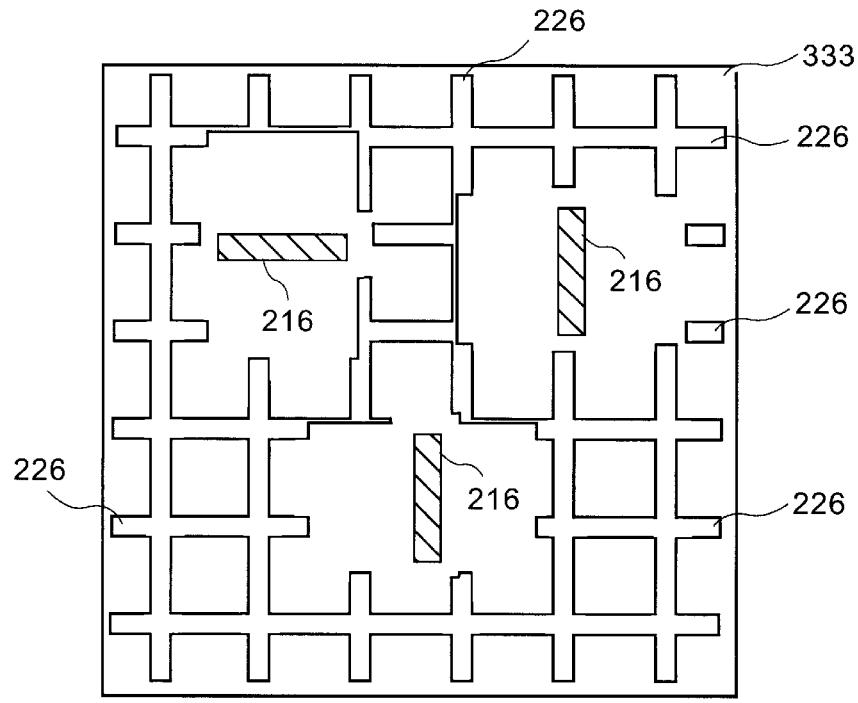

FIG. 3K shows a final polysilicon and dummy polysilicon mask 333, which includes both the modified polysilicon mask 330' and the polysilicon lines 216 of FIG. 3A. As can be appreciated, the polysilicon lines 226 interconnect as many dummy active regions 214 as possible throughout the device where no active device regions lie. By interconnecting the dummy active regions 214 using the dummy polysilicon lines 226, it is possible to construct capacitive structures at each of the dummy active regions 214, and then interconnect those dummy active regions 214 using the dummy polysilicon lines 226.

This technique essentially creates capacitive structures throughout a device in regions where the silicon substrate would otherwise remain as wasted space. As can be appreciated, this techniques essentially produces multiple capacitive structures throughout the substrate while at the same time, producing a substantially planar surface for subsequent chemical mechanical polishing operations.

The following table illustrates the logical operations that are performed to generate the final polysilicon and dummy polysilicon mask 333 of FIG. 3K.

TABLE B

Final Poly & Dummy Poly

| Step | Operation Performed | Mask Produced |
|---|---|---|
| 1 | Bloat {Poly Regions} | Mask 306 |
| 2 | Invert Mask 306 | Mask 306' |
| 3 | {Mask 330} AND {Mask 306'} | Intermediate Mask |
| 4 | {Intermediate Mask} AND {Mask 304'} | Mask 330' |
| 5 | {Mask 330'} OR {Poly Regions} | Mask 333 |

Figure 3L:
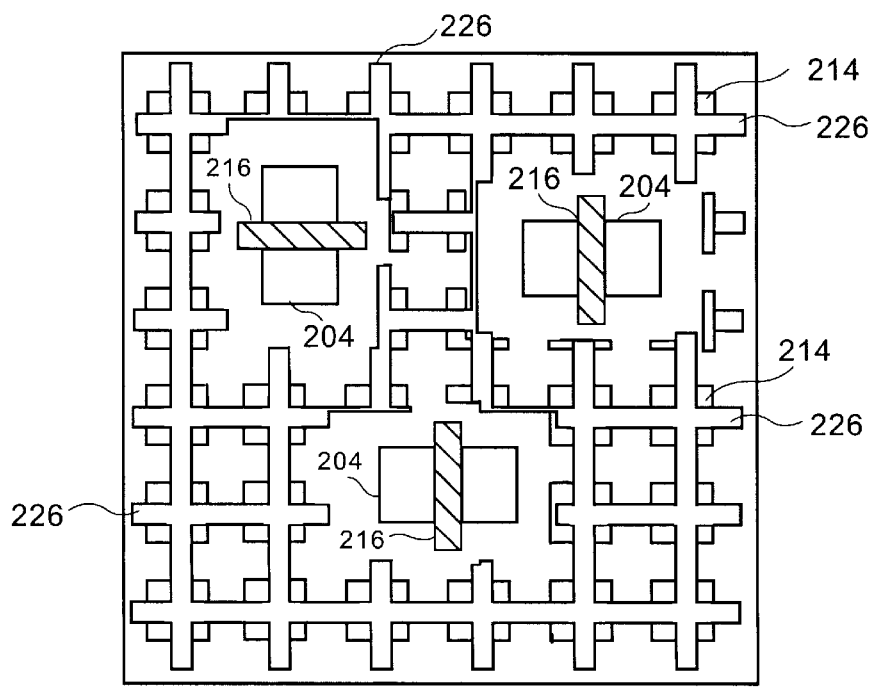

FIG. 3L illustrates an example of when both the final active and dummy active mask 303 of FIG. 3F and the final polysilicon and dummy polysilicon mask 333 of FIG. 3K are combined. Of course, in practice, these masks are used at different photolithography stages of the semiconductor processing operations, and are therefore shown for illustration purposes.

It should be noted that the active regions 204 and the polysilicon lines 216 are substantially isolated from the dummy capacitive network established by the dummy polysilicon lines 226 and the dummy active regions 214. Accordingly, the device will still function in normal operation without disturbance, and a substantial and adequate level of inductive noise will be suppressed throughout the semiconductor substrate in those regions where the dummy active regions 214 and the dummy polysilicon lines 226 form the capacitive network structure.

Figure 4A:
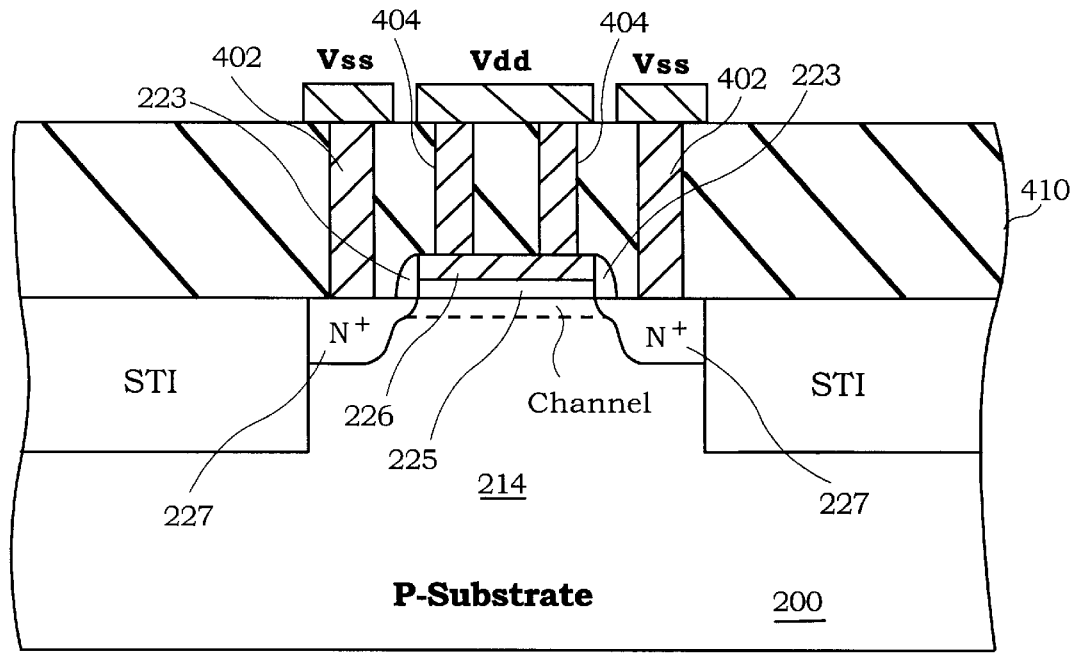
FIGS. 4A–4B illustrate a cross-sectional view of a capacitive structure that is formed over a given dummy active region in accordance with one embodiment of the present invention.

FIG. 4A shows a cross-sectional view of a semiconductor substrate 200 where a dummy active region 214 resides in accordance with one embodiment of the present invention. As mentioned above, the dummy polysilicon lines 226 are designed as a network of polysilicon lines which interconnect most of the dummy active regions 214 to create capacitive structures between a ground rail voltage (Vss) and a power supply rail voltage (Vdd). To accomplish this, contacts 402 are designed down to N+ diffusion regions 227, which are coupled to ground Vss.

The polysilicon lines 226 form a gate that is coupled to the power supply rail (Vdd) through contacts 404. In this example, the semiconductor substrate 200 is a P-type substrate, which therefore produces a channel between the N+ diffusion regions 227 when a voltage Vdd is applied to the gate 226. In this example, an oxide layer 410 is deposited over the entire substrate, planarized, and then metallization is formed and patterned to generate the metallization lines which interconnect the ground rail voltage Vss and the power supply rail voltage Vdd to the respective portions of the dummy active regions 214.

Figure 4B:
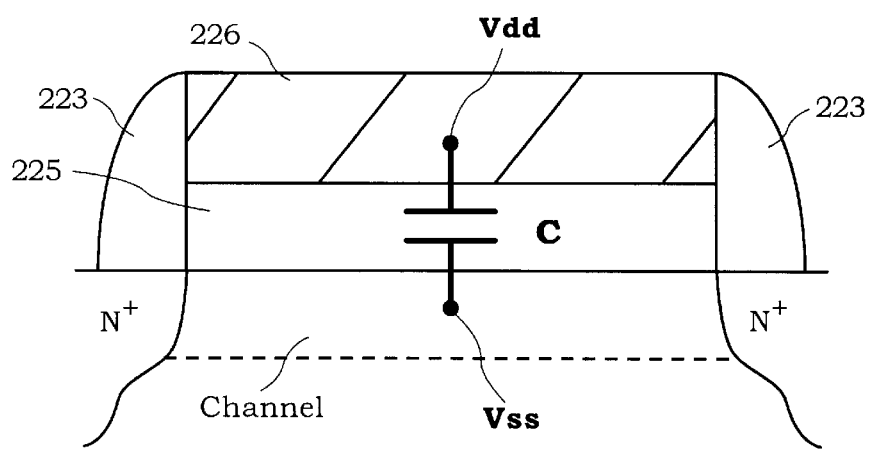

FIG. 4B shows a magnified version of the polysilicon gate 226 that lies over a gate oxide 225 in accordance with one embodiment of the present invention. As pictorially shown, a capacitor dielectric is thus established in the gate oxide 225 between the polysilicon gate 226 and the channel that lies between the diffusion regions 227. Accordingly, as inductive noise is produced by the power supplies of a particular device design, the network of capacitive structures that are formed in the dummy active regions 214 will be well suited to suppress that inductive noise without the need for off-chip discrete capacitor devices.

Advantageously, by suppressing the inductive noise through the capacitive structures formed in the dummy active regions 214, it is also possible to internally suppress inductive noise without having to custom design capacitive structures in custom regions of a semiconductor die. That is, all of the capacitive structures that are formed throughout a device are formed in regions which would otherwise be unutilized wasted space. Therefore, not only is noise being suppressed throughout the network of capacitive structures formed in the dummy active regions 214, but a more planar profile is produced throughout a semiconductor substrate because the dummy active regions 214 assist in raising the topology which eliminates large variations in the shallow trench isolation regions.

Figure 5A:
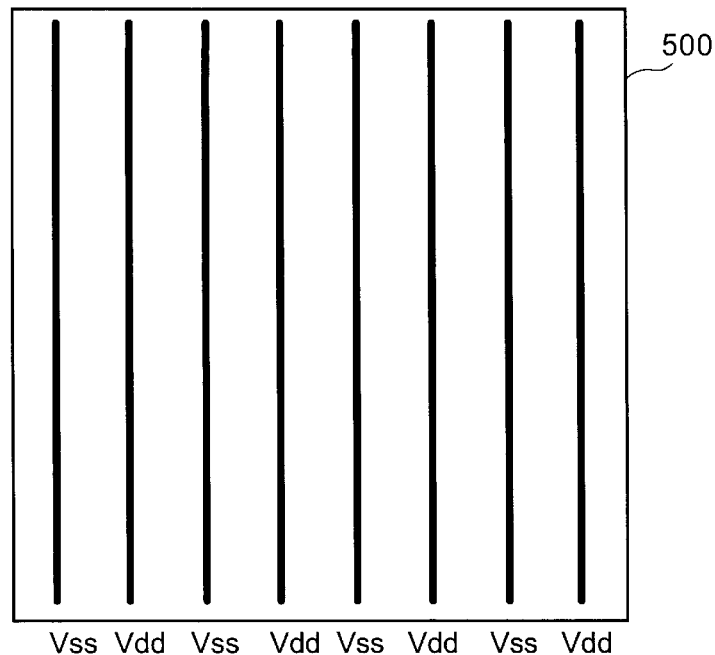
FIGS. 5A–5E illustrate the mask processing operations used to interconnect the power supply rail Vdd to respective dummy polysilicon, and to interconnect the ground rail Vss to respective dummy active regions.

FIG. 5A shows an exemplary power rail layout 500, wherein the power source rail Vdd and the ground rail Vss are laid out over a particular device. Typically, the power and ground rail mask is used toward the end of semiconductor processing operations, and the interconnection between power and ground is completed through a network of interconnecting vias.

Figure 5B:
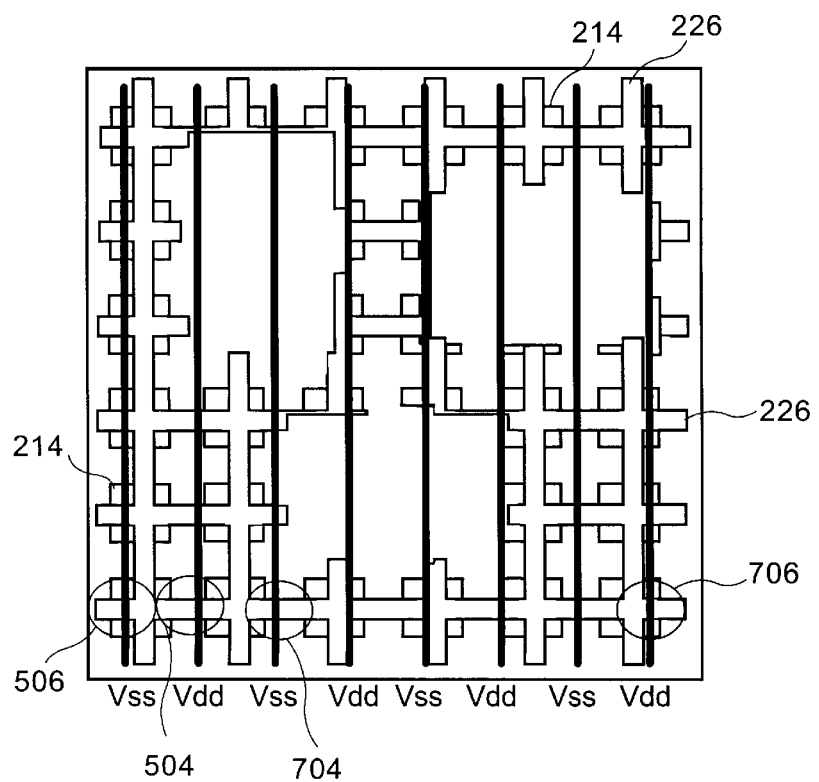
Figure 5C:
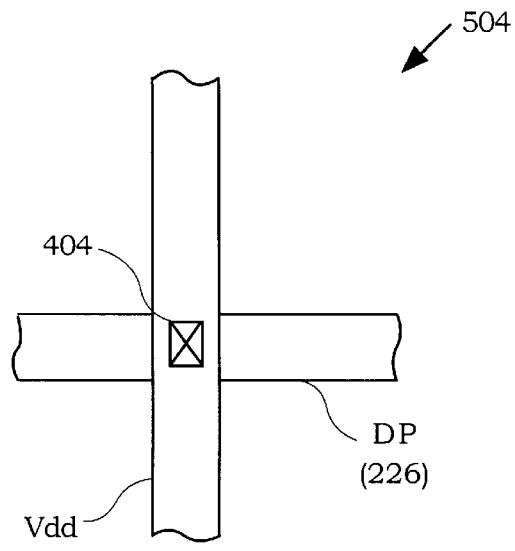
Figure 5D:
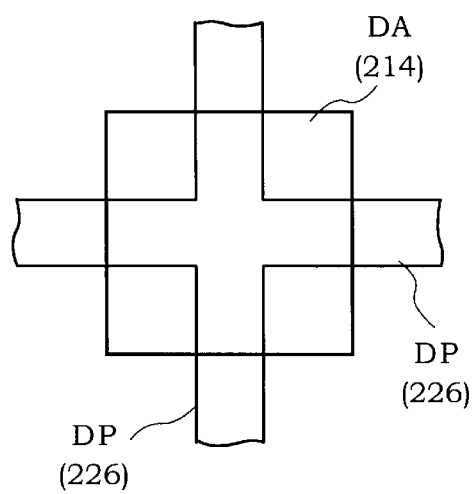

To interconnect the respective power supply rail Vdd to the selected dummy polysilicon lines 226, the mask generator software will perform a logical AND operation between the modified polysilicon mask 330' of FIG. 3J and the power supply rail Vdd line mask. As shown in FIG. 5C and 504 of FIG. 5B, when an intersection (i.e., overlap) is identified as a result of the AND operation, a contact 404 is designed for interconnecting the Vdd line to the dummy polysilicon line 226 as shown in the cross-section of FIG. 4A. In order to interconnect the Vss ground rail to the dummy active region 214, the modified polysilicon mask 330' is first inverted and then processed through a logical AND operator with the dummy active regions 214 of FIG. 3E.

Figure 5E:
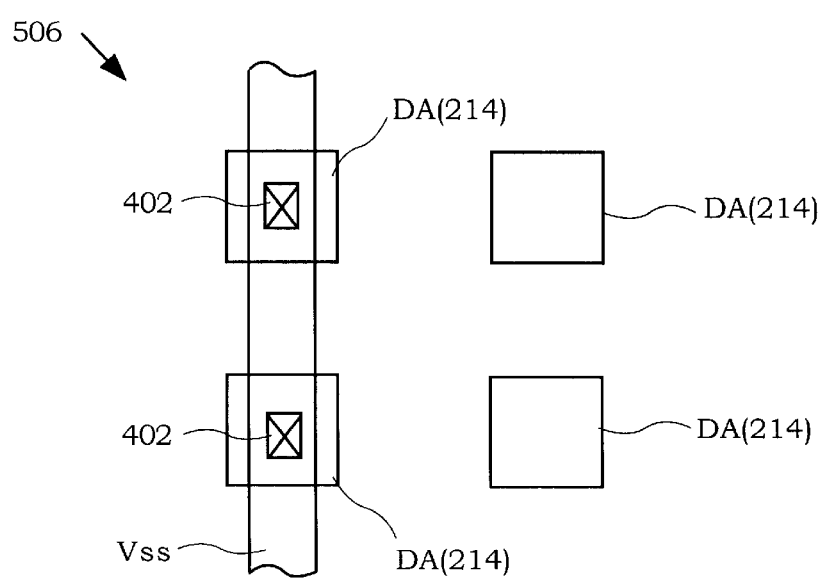

The result of this logical AND operation will be to form the dummy active regions 214 which are shown in FIG. 5E. FIG. 5E also shows an example of a ground rail Vss traversing over portions (i.e., overlapping) of the dummy active regions 214, which are shown as 506 in FIG. 5B. The intersection of these regions is determined by performing a logical AND operation between the dummy active regions 214 of FIG. 5E and the ground rail Vss mask. At those intersections, contacts 402 are designed. The contacts 402 which interconnect to the ground rail Vss are also shown in the cross-section of FIG. 4A.

Figure 6:
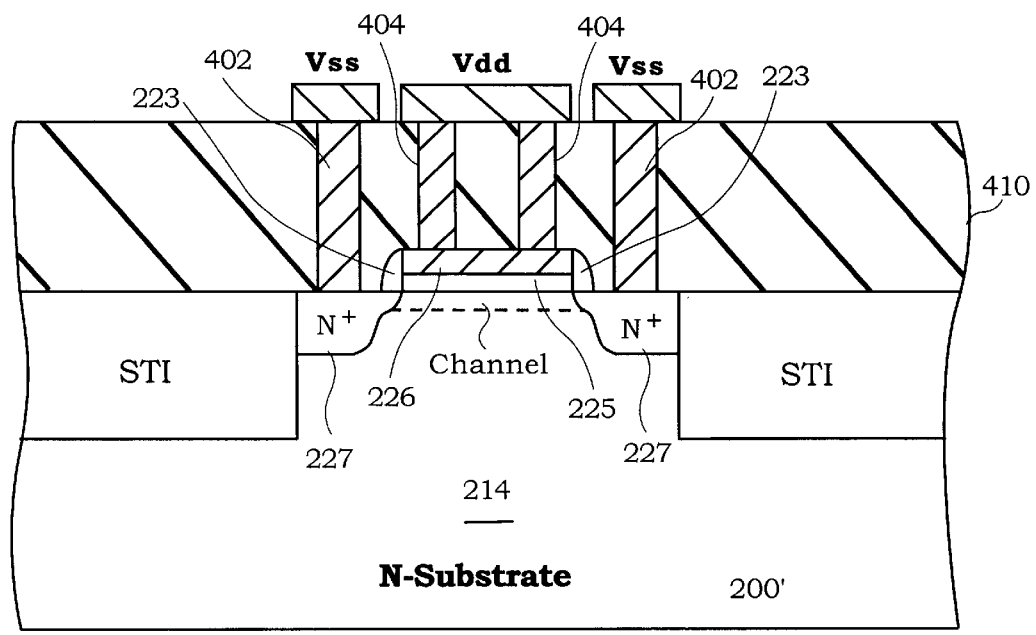
FIG. 6 is a cross-sectional view of the capacitive structure fabricated over the dummy active regions of an N-type substrate in accordance with one embodiment of the present invention.

FIG. 6 is a cross-sectional view of the capacitive structure fabricated over the dummy active regions 214 in accordance with one embodiment of the present invention. As in the cross-section of FIG. 4A, a capacitive structure is formed between plates defined by the channel and the polysilicon gate 226. In this alternative embodiment, the semiconductor substrate 200' is an N-type substrate. Because the dummy active region 214 is defined in an N-type substrate, the transistor structure formed by the polysilicon gate 226 and the N+ diffusion regions 227 will form a charge accumulation type transistor. The accumulation transistor therefore builds up a capacitive charge within the dielectric of the gate oxide 225.

Figure 7A:
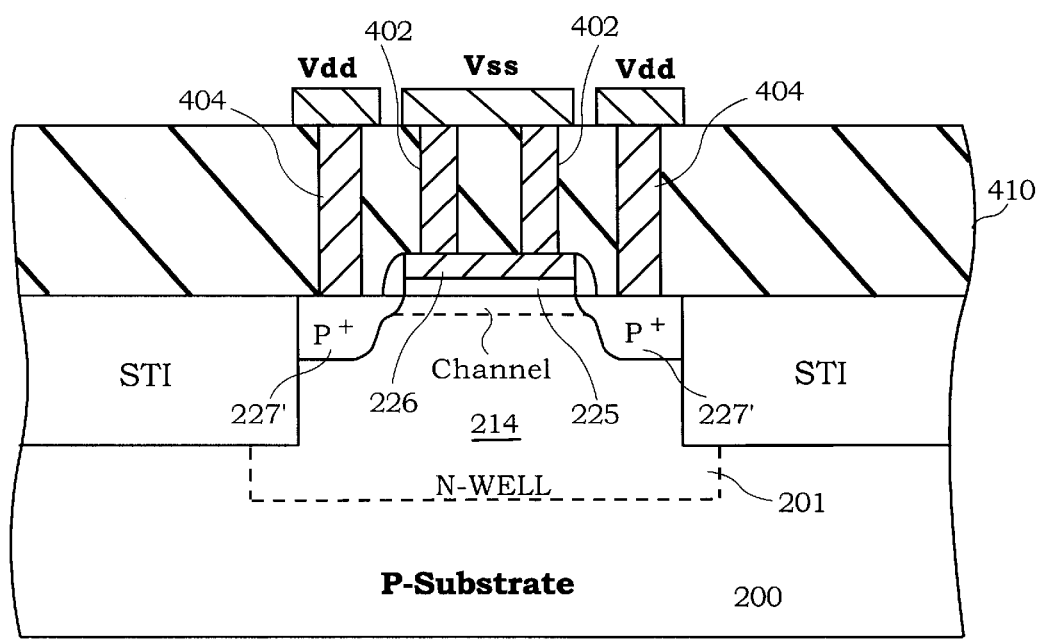
FIG. 7A is a cross-sectional view of the capacitive structure fabricated over the dummy active regions of a P-type substrate having an N-well in accordance with one embodiment of the present invention.

FIG. 7A shows yet another embodiment in which the dummy active region 214 is formed in an N-well 201 that lies within the semiconductor substrate 200. The semiconductor substrate 200 is a P-type substrate, and the transistor diffusion regions are P+ diffusion regions 227', that lie within the N-well 201. In this embodiment, the gate electrode 226 is coupled to Vss through contacts 402 that are formed through the oxide layer 410.

The P+ diffusion regions 227' are likewise connected to Vdd through contacts 404 that are defined through the oxide layer 410. In this manner, when a ground voltage Vss is applied to the transistor gate 226, a channel is formed between the P+ diffusions regions 227'. Once activated, the dummy active regions 214 will form a network of capacitive structures which are advantageously interconnected through the polysilicon lines 226, which form the gates over the dummy active regions 214.

To interconnect the respective ground rail Vss to the selected dummy polysilicon lines 226, the mask generator software will perform a logical AND operation between the modified polysilicon mask 330' of FIG. 3J and the ground rail Vss line mask. As shown in FIG. 7B and 704 of FIG. 5B, when an intersection (i.e., overlap) is located as a result of the AND operation, a contact 402 is designed for interconnecting the Vss line to the dummy polysilicon line 226 as shown in the cross-section of FIG. 7A. In order to interconnect the Vdd power supply rail to the dummy active region 214, the modified polysilicon mask 330' is first inverted and then processed through a logical AND operator with the dummy active regions 214 of FIG. 3E.

The result of this logical AND operation will be to form the dummy active regions 214 which are shown in FIG. 7D. FIG. 7D also shows an example of a power supply rail Vdd traversing over portions of the dummy active regions 214, which are shown as 706 in FIG. 5B. The intersection of these regions is determined by performing a logical AND operation between the dummy active regions 214 of FIG. 7D and the power supply rail Vdd mask. At those intersections, contacts 404 are designed. The contacts 404 which interconnect to the power supply rail Vdd are also shown in the cross-section of FIG. 7A.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations. An exemplary structure for the invention is described below.

Figure 8:
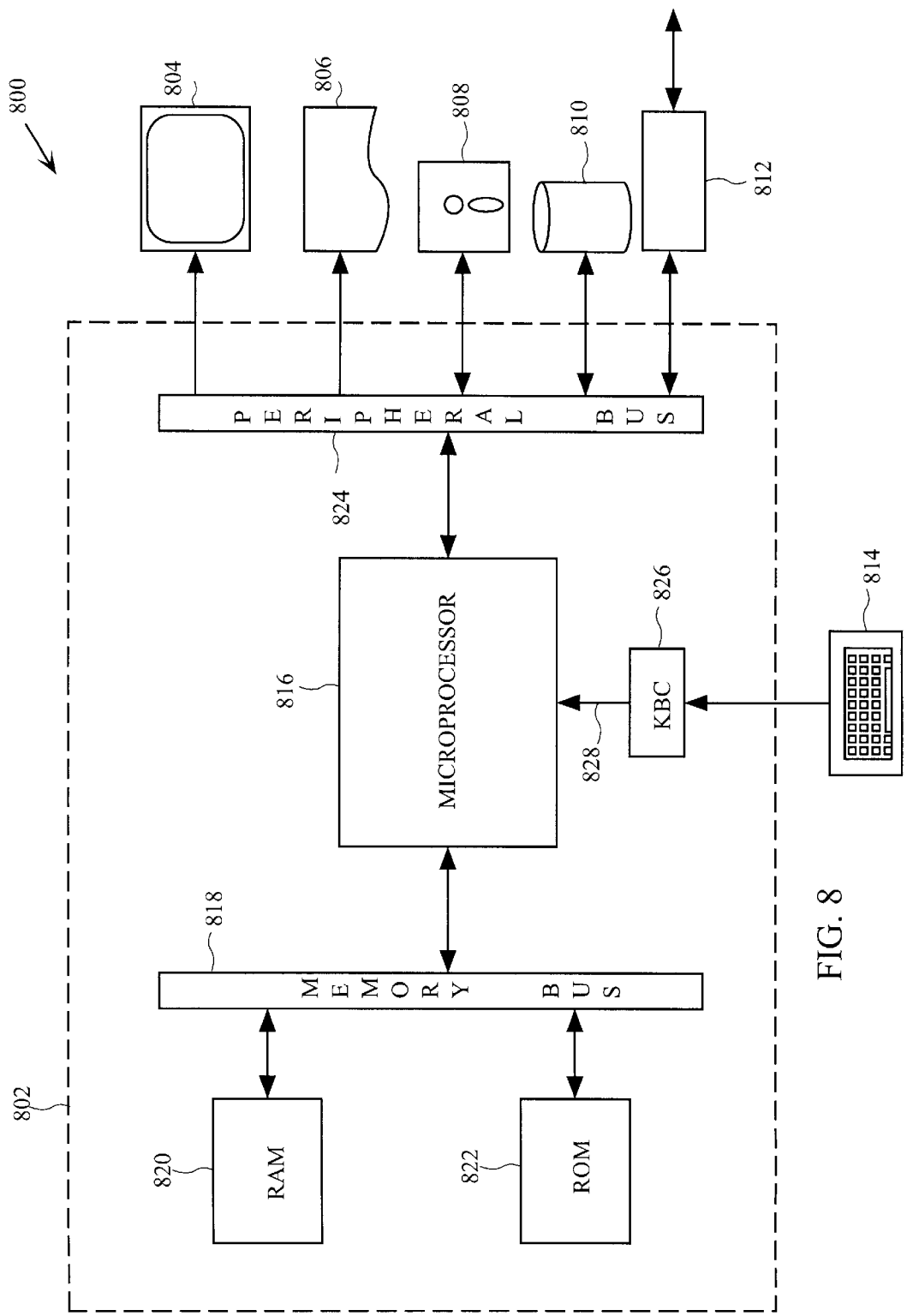
FIG. 8 is a block diagram of an exemplary computer system for carrying out the processing according to the invention.

FIG. 8 is a block diagram of an exemplary computer system 800 for carrying out the processing according to the invention. The computer system 800 includes a digital computer 802, a display screen (or monitor) 804, a printer 806, a floppy disk drive 808, a hard disk drive 810, a network interface 812, and a keyboard 814. The digital computer 802 includes a microprocessor 816, a memory bus 818, random access memory (RAM) 820, read only memory (ROM) 822, a peripheral bus 824, and a keyboard controller 826. The digital computer 800 can be a personal computer (such as an IBM compatible personal computer, a Macintosh computer or Macintosh compatible computer), a workstation computer (such as a Sun Microsystems or Hewlett-Packard workstation), or some other type of computer.

The microprocessor 816 is a general purpose digital processor which controls the operation of the computer system 800. The microprocessor 816 can be a single-chip processor or can be implemented with multiple components. Using instructions retrieved from memory, the microprocessor 816 controls the reception and manipulation of input data and the output and display of data on output devices. According to the invention, a particular function of microprocessor 816 is to assist in performing the mask generation and layout logical operations.

The memory bus 818 is used by the microprocessor 816 to access the RAM 820 and the ROM 822. The RAM 820 is used by the microprocessor 816 as a general storage area and as scratch-pad memory, and can also be used to store input data and processed data. The ROM 822 can be used to store instructions or program code followed by the microprocessor 816 as well as other data.

The peripheral bus 824 is used to access the input, output, and storage devices used by the digital computer 802. In the described embodiment, these devices include the display screen 804, the printer device 806, the floppy disk drive 808, the hard disk drive 810, and the network interface 812. The keyboard controller 826 is used to receive input from keyboard 814 and send decoded symbols for each pressed key to microprocessor 816 over bus 828.

The display screen 804 is an output device that displays images of data provided by the microprocessor 816 via the peripheral bus 824 or provided by other components in the computer system 800. The printer device 806 when operating as a printer provides an image on a sheet of paper or a similar surface. Other output devices such as a plotter, typesetter, etc. can be used in place of, or in addition to, the printer device 806.

The floppy disk drive 808 and the hard disk drive 810 can be used to store various types of data. The floppy disk drive 808 facilitates transporting such data to other computer systems, and hard disk drive 810 permits fast access to large amounts of stored data.

The microprocessor 816 together with an operating system operate to execute computer code and produce and use data. The computer code and data may reside on the RAM 820, the ROM 822, or the hard disk drive 810. The computer code and data could also reside on a removable program medium and loaded or installed onto the computer system 800 when needed. Removable program mediums include, for example, CD-ROM, PC-CARD, floppy disk and magnetic tape.

The network interface 812 is used to send and receive data over a network connected to other computer systems. An interface card or similar device and appropriate software implemented by the microprocessor 816 can be used to connect the computer system 800 to an existing network and transfer data according to standard protocols.

The keyboard 814 is used by a user to input commands and other instructions to the computer system 800. Other types of user input devices can also be used in conjunction with the present invention. For example, pointing devices such as a computer mouse, a track ball, a stylus, or a tablet can be used to manipulate a pointer on a screen of a general-purpose computer.

The invention can also be embodied as computer readable code on a computer readable medium. The computer readable medium is any data storage device that can store data which can be thereafter be read by a computer system. Examples of the computer readable medium include read-only memory, random-access memory, CD-ROMs, magnetic tape, optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A network of on-chip capacitive structures for suppressing power supply inductive noise, comprising:

a plurality of dummy active regions that are dispersed throughout an integrated circuit design that has a plurality of active regions, the plurality of dummy active regions being separated from the plurality of active regions by at least a bloat distance; and a network of dummy polysilicon lines being configured to overlie selected dummy active regions, the network of dummy polysilicon lines having a predefined pattern that does not lie over the plurality of active regions, and the network of dummy polysilicon lines that overlie the selected dummy active regions functioning as dummy gates that substantially interconnects the plurality of dummy active regions;

wherein the selected dummy active regions and the dummy polysilicon lines that overlie the selected dummy active regions form the network of on-chip capacitive structures.

2. A network of on-chip capacitive structures for suppressing power supply inductive noise as recited in claim 1, further comprising:

a plurality of power supply contacts; and a plurality of ground contacts, such that the plurality of power supply contacts and the ground contacts interconnect to the selected dummy active regions and the dummy polysilicon lines.

3. A network of on-chip capacitive structures for suppressing power supply inductive noise as recited in claim 2, wherein the plurality of power supply contacts are electrically coupled to the network of dummy polysilicon lines, and the plurality of ground contacts are electrically coupled to the plurality of dummy active regions.

4. A network of on-chip capacitive structures for suppressing power supply inductive noise as recited in claim 2, wherein the plurality of power supply contacts are electrically coupled to the plurality of dummy active regions and the plurality of ground contacts are electrically coupled to the network of dummy polysilicon lines.

5. A network of on-chip capacitive structures for suppressing power supply inductive noise as recited in claim 2, wherein the network of dummy polysilicon lines are arranged in a grid of vertical and horizontal lines.

6. A network of on-chip capacitive structures for suppressing power supply inductive noise as recited in claim 5, wherein the grid of vertical and horizontal lines intersect respective ones of the plurality of dummy active regions.

7. A network of on-chip capacitive structures for suppressing power supply inductive noise as recited in claim 2, wherein the plurality of dummy active regions are arranged in a array of discrete dummy active regions.

8. A network of on-chip capacitive structures for suppressing power supply inductive noise as recited in claim 7, wherein each of the discrete dummy active regions that have an overlying section of the network of dummy polysilicon lines form a capacitive structure having a gate oxide dielectric.

9. A network of on-chip capacitive structures for suppressing power supply inductive noise as recited in claim 5, wherein portions of the network of dummy polysilicon lines are eliminated where a bloated active region and a bloated active polysilicon region are located.

10. A method for making a network of on-chip capacitive structures for suppressing power supply inductive noise, comprising the acts of:

designing a plurality of dummy active regions that are dispersed throughout an integrated circuit design that has a plurality of active regions, the plurality of dummy active regions being separated from the plurality of active regions by at least a bloat distance; and designing a network of dummy polysilicon lines being configured to overlie selected dummy active regions, the network of dummy polysilicon lines that overlie the selected dummy active regions functioning as dummy gates;

wherein the selected dummy active regions and the dummy polysilicon lines that overlie the selected dummy active regions define capacitor structure locations for the network of on-chip capacitive structures.

11. A method for making a network of on-chip capacitive structures for suppressing power supply inductive noise as recited in claim 10, further comprising the act of:

designing a power supply mask; and performing a logical AND operation between the power supply mask and the network of dummy polysilicon lines, the logical AND operation defining a power overlap area that identifies a location for a power supply contact.

12. A method for making a network of on-chip capacitive structures for suppressing power supply inductive noise as recited in claim 10, further comprising the act of:

designing a ground rail mask;

performing a logical AND operation between an inverted network of dummy polysilicon lines and the plurality of dummy active regions to produce a modified dummy active pattern; and performing a logical AND operation between the ground rail mask and the modified dummy active pattern to produce a ground overlap area that identifies a location for a ground rail contact.

13. A method for making a network of on-chip capacitive structures for suppressing power supply inductive noise as recited in claim 10, wherein the designing the plurality of dummy active regions further comprises:

providing a mask having the plurality of active regions;

bloating the plurality of active regions to produce a plurality of bloated active regions mask;

inverting the plurality of bloated active regions mask to produce an inverted plurality of bloated active regions mask; and performing a logical AND operation between the inverted plurality of bloated active regions mask and a mask having the plurality of dummy active regions to produce a modified dummy active regions mask.

14. A method for making a network of on-chip capacitive structures for suppressing power supply inductive noise as recited in claim 13, further comprising:

performing a logical OR operation between the modified dummy active regions mask and the mask having the plurality of active regions to produce a final active region and dummy active region mask.

15. A method for making a network of on-chip capacitive structures for suppressing power supply inductive noise as recited in claim 13, wherein the designing the network of dummy polysilicon lines further comprises:

providing a mask having a grid of dummy polysilicon lines;

bloating a plurality of active polysilicon lines to produce a plurality of bloated polysilicon lines mask;

inverting the plurality of bloated polysilicon lines mask to produce an inverted plurality of bloated polysilicon lines mask;

performing a logical AND operation between the inverted plurality of bloated polysilicon lines mask and the mask having the grid of dummy polysilicon lines to produce an intermediate grid of dummy polysilicon lines mask; and performing a logical AND operation between the inverted plurality of bloated active regions mask and the intermediate grid of dummy polysilicon lines mask to produce a modified grid of dummy polysilicon lines mask.

16. A method for making a network of on-chip capacitive structures for suppressing power supply inductive noise as recited in claim 15, further comprising:

performing a logical OR operation between the modified grid of dummy polysilicon lines mask and the plurality of active polysilicon lines to produce a final polysilicon line and dummy polysilicon line mask.

17. A method for making a network of on-chip capacitive structures for suppressing power supply inductive noise as recited in claim 16, wherein the final polysilicon line and dummy polysilicon line mask and the final active region and dummy active region mask are used to form the network of on-chip capacitive structures for suppressing power supply inductive noise.

18. A system for designing a network of on-chip capacitive structures for suppressing power supply inductive noise, comprising:

means for designing a plurality of dummy active regions that are dispersed throughout an integrated circuit design that has a plurality of active regions, the plurality of dummy active regions being separated from the plurality of active regions by at least a bloat distance, the plurality of dummy active regions are further configured to reduce topographical variations in shallow isolation regions that are designed around the plurality of dummy active regions and the plurality of active regions; and means for designing a network of dummy polysilicon lines being configured to overlie selected dummy active regions, the network of dummy polysilicon lines that overlie the selected dummy active regions functioning as dummy gates;

wherein the selected dummy active regions and the dummy polysilicon lines that overlie the selected dummy active regions define capacitor structure locations for the network of on-chip capacitive structures.

19. A system for designing a network of on-chip capacitive structures for suppressing power supply inductive noise as recited in claim 18, wherein the means for designing the plurality of dummy active regions further comprises:

providing a mask having the plurality of active regions;

means for bloating the plurality of active regions to produce a plurality of bloated active regions mask;

means for inverting the plurality of bloated active regions mask to produce an inverted plurality of bloated active regions mask; and means for performing a logical AND operation between the inverted plurality of bloated active regions mask and a mask having the plurality of dummy active regions to produce a modified dummy active regions mask.

20. A system for designing a network of on-chip capacitive structures for suppressing power supply inductive noise as recited in claim 19, further comprising:

performing a logical OR operation between the modified dummy active regions mask and the mask having the plurality of active regions to produce a final active region and dummy active region mask.

21. A system for designing a network of on-chip capacitive structures for suppressing power supply inductive noise as recited in claim 19, wherein the designing the network of dummy polysilicon lines further comprises:

providing a mask having a grid of dummy polysilicon lines;

means for bloating a plurality of active polysilicon lines to produce a plurality of bloated polysilicon lines mask;

means for inverting the plurality of bloated polysilicon lines mask to produce an inverted plurality of bloated polysilicon lines mask;

means for performing a logical AND operation between the inverted plurality of bloated polysilicon lines mask and the mask having the grid of dummy polysilicon lines to produce an intermediate grid of dummy polysilicon lines mask; and means for performing a logical AND operation between the inverted plurality of bloated active regions mask and the intermediate grid of dummy polysilicon lines mask to produce a modified grid of dummy polysilicon lines mask.

* * * * *